United States Patent [19]

Aboaf et al.

[11] 3,767,463

[45] Oct. 23, 1973

[54] METHOD FOR CONTROLLING SEMICONDUCTOR SURFACE POTENTIAL

[75] Inventors: Joseph A. Aboaf, Peekskill; Thomas O. Sedgwick, Crompound, both of N.Y.

[73] Assignee: International Business Machines Corporation, Armonk, N.Y.

[22] Filed: Feb. 10, 1971

[21] Appl. No.: 114,369

Related U.S. Application Data

[63] Continuation of Ser. No. 609,200, Jan. 13, 1967, abandoned.

[52] U.S. Cl. .......... 117/215, 117/106 R, 317/235 R

[51] Int. Cl. .......... B44d 1/18

[58] Field of Search .......... 117/212, 215, 217, 117/106; 317/235, 235 R

[56] References Cited

UNITED STATES PATENTS

| | | | |
|---|---|---|---|
| 3,431,636 | 3/1969 | Granberry et al. | 29/578 |
| 3,479,237 | 11/1969 | Bergh et al. | 156/11 |
| 3,438,873 | 4/1969 | Schmidt | 204/35 |
| 3,386,163 | 6/1968 | Brennemann et al. | 29/571 |
| 3,502,950 | 3/1970 | Nigh et al. | 317/235 |
| 3,351,825 | 11/1967 | Vidas | 317/235 |
| 3,287,187 | 11/1966 | Rosenheinrich | 148/187 |
| 3,298,879 | 1/1967 | Scott, Jr. et al. | 148/187 |
| 3,672,984 | 6/1972 | Sato et al. | 117/212 |
| 3,681,155 | 8/1972 | Elgan et al. | 117/215 |

*Primary Examiner*—Cameron K. Weiffenbach
*Attorney*—Thomas J. Kilgannon

[57] ABSTRACT

A method for controlling semiconductor surface potential in which metal oxides such as silicon dioxide and aluminum oxide are deposited as a mixture or sequentially on the surface of a semiconductor such as silicon or germanium at temperatures below which diffusion of constituents of the oxides normally does not occur. The deposition of the metal oxides is carried out in an nonoxidizing atmosphere such as nitrogen or forming gas. Changing the mixture of metal oxides in the nonoxidizing gas environment changes the effective surface charge on a semiconductor. The sequential deposition of a silicon dioxide layer and an aluminum oxide layer in nitrogen with a subsequent heating step to form a mixture of metal oxides also produces changes in the effective surface charge depending on the amount of mixture formed.

11 Claims, 3 Drawing Figures

INVENTORS
JOSEPH A. ABOAF
THOMAS O. SEDGWICK

BY Thomas J. Kilgannon Jr.
ATTORNEY

METHOD FOR CONTROLLING SEMICONDUCTOR SURFACE POTENTIAL

CROSS REFERENCE TO A RELATED APPLICATION

This application is a continuation of Ser. No. 609,200 filed Jan. 13, 1967, now abandoned.

BACKGROUND OF THE INVENTION

1. Field of the Invention

This invention relates generally to a method for controlling semiconductor surface potential and more particularly relates to a method for controlling the amount of induced surface charge at the interface of a semiconductor and a metal oxide layer or layers which has been deposited on the semiconductor. The method is particularly applicable to the transistor art because it permits the manufacture of devices such as field effect transistors in which the induced surface charge can be precisely controlled.

2. Description of the Prior Art

The presence of induced surface charges when a metal oxide layer is deposited on a semiconductor surface has been known for many years. Haenichen, in U.S. Pat. No. 3,226,612, discusses the formation of N-induced channels in P-tye semiconductor material when the semiconductor surface is covered with a passivating film such as silicon dioxide. The patent also discusses the formation of P-induced channels in N-type material under the same circumstances. Such inversions are widely recognized and have been found to be particularly deleterious in n-p-n field effect transistors where the induced n-channel resulting from an overlying layer of silicon dioxide causes the device to be normally-on thereby requiring a bias source to make such devices normally-off.

The prior art has adopted various expedients to overcome the effect of induced surfaces charges which invert the conductivity type of the underlying semiconductor. Haenichen, for instance, uses well-known selective diffusion techniques to lower the resistivity of pi silicon in order to interrupt induced N regions occurring in silicon dioxide -pi silicon and glass-pi silicon interfaces. Others have utilized P and N- type dopants included in the passivating layer to convert or neutralize the effects of the channel induced by the passivating layer. Indeed, others have applied passivating films of metal oxides and mixtures thereof to the surface of semiconductors but, in all cases, to diffuse a constituent of the passivating film into the semiconductor bulk to obtain a region of desired conductivity type. Thus, aluminum and boron have been used as P-type dopants while phosphorous and arsenic have been used as N-type dopants. It is significant to note that such diffusions permanently affect the bulk of the semiconductor and the conductivity type remains unchanged when the passivating film is removed.

The expedients used by the prior art are expensive and time consuming and are merely methods which teach the art how to live with the problem of induced surface charges. The present invention addresses the problem directly and, as will be shown hereinbelow, teaches how the problem may be controlled and, indeed, turned to advantage in manufacturing semiconductor devices.

SUMMARY OF THE INVENTION

In accordance with the broadest aspect of the present invention, a plurality of metal oxides such as aluminum and silicon oxide are deposited on the surface of a semiconductor substrate at temperatures below which diffusion of the constituents of the metal oxides normally does not occur. The deposition is carried out in a nonoxidizing atmosphere which may be an inert or reducing gas.

In accordance with more particular aspects of this invention, the deposition of the metal oxides may be carried out simultaneously or sequentially to form a mixture of the oxides or layers of the oxides, respectively, on the surface of a semiconductor substrate. When a mixture of metal oxides is deposited in a nonoxidizing gas, nitrogen, for instance, a given surface charge is induced. By simply varying the mixture of metal oxides in the same gas, a different induced surface charge is produced for each mixture. Using the foregoing techniques, it is possible to control the surface charge to a desired value which includes the range of conductivity types from N to P.

When the deposition of metal oxides is carried out sequentially, each oxide is usually deposited in a single gas, nitrogen. A mixture of nonoxidizing gases can also be used. The sequential deposition of the metal oxides is followed by a heating step which causes the formation of a mixture of the oxides in the region of the interface of the oxides. The deposition of silicon dioxide on a P-type semiconductor substrate, as indicated hereinabove, can be expected to induce an N-type region. The subsequent deposition of a layer of aluminum oxide and heating of the layered semiconductor can then be expected to convert the N-type induced region in the direction of P-type conductivity. The duration of the heating time affects the extent to which the metal oxides mix and the thickness of the initially deposited silicon dioxide layer also affects the heating time and temperature. As a result, the induced surface charge can be varied by a variation in any one of the above mentioned parameters.

The mechanism whereby the mixed oxide induces a particular conductivity type on a semiconductor surface is not well understood but, it is believed that the elimination of a chemical specie such as oxygen or metal ions, either alone or in combination with other species present at the semiconductor surface is one controlling factor. In addition, the inherent properties of the aluminum oxide mixture appear to be another controlling factor.

The deposition of the metal oxides alone or as a mixture is preferably accomplished by the decomposition of organic silicon and aluminum compounds in the region of a heated semiconductor substrate in either a single nonoxidizing gas or in a mixture of nonoxidizing gases. The result of the present teaching is that semiconductor substrates can be provided on which the induced surface charge can be selected in advance by simply selecting the conditions for depositing the metal oxides.

It is, therefore, an object of this invention to provide a method for controlling the induced surface charges on a semiconductor surface.

Another object is to provide a method for depositing metal oxide films by which the value of surface charge can be changed to provide a semiconductor which has a P,N or neutral conductivity type near its surface.

Another object is to provide a method for controlling induced surface charges which is superior to prior art attempts.

The foregoing and other objects, features and advantages of the invention will be apparent from the following more particular description of preferred embodiments of the invention as illustrated in the accompanying drawings:

DETAILED DESCRIPTION OF PREFERRED EMBODIMENTS OF THE INVENTION

Before proceeding with the description, it should be appreciated that the term "depositing" is intended to encompass all known methods for laying down metal oxide films or layers where an oxidizing atmosphere is not required. Thus, sputtering, either R.F. or D.C. sputtering, evaporating, vacuum deposition, or ion beam deposition of metal oxide films may be utilized in the practice of this invention.

Further, it should be appreciated that where a gas is called for the gas may be present in only trace amounts depending on the deposition technique utilized. The pressure of the gas or gases is not critical, but it should be present in at least trace amounts.

In addition, where temperatures are specified, it should be appreciated that such temperatures are preferred temperatures. In any of the deposition techniques referred to above, however, the temperatures attained should be below the temperatures at which the constituents of the metal oxides normally diffuse into any selected semiconductor.

Figure 1:
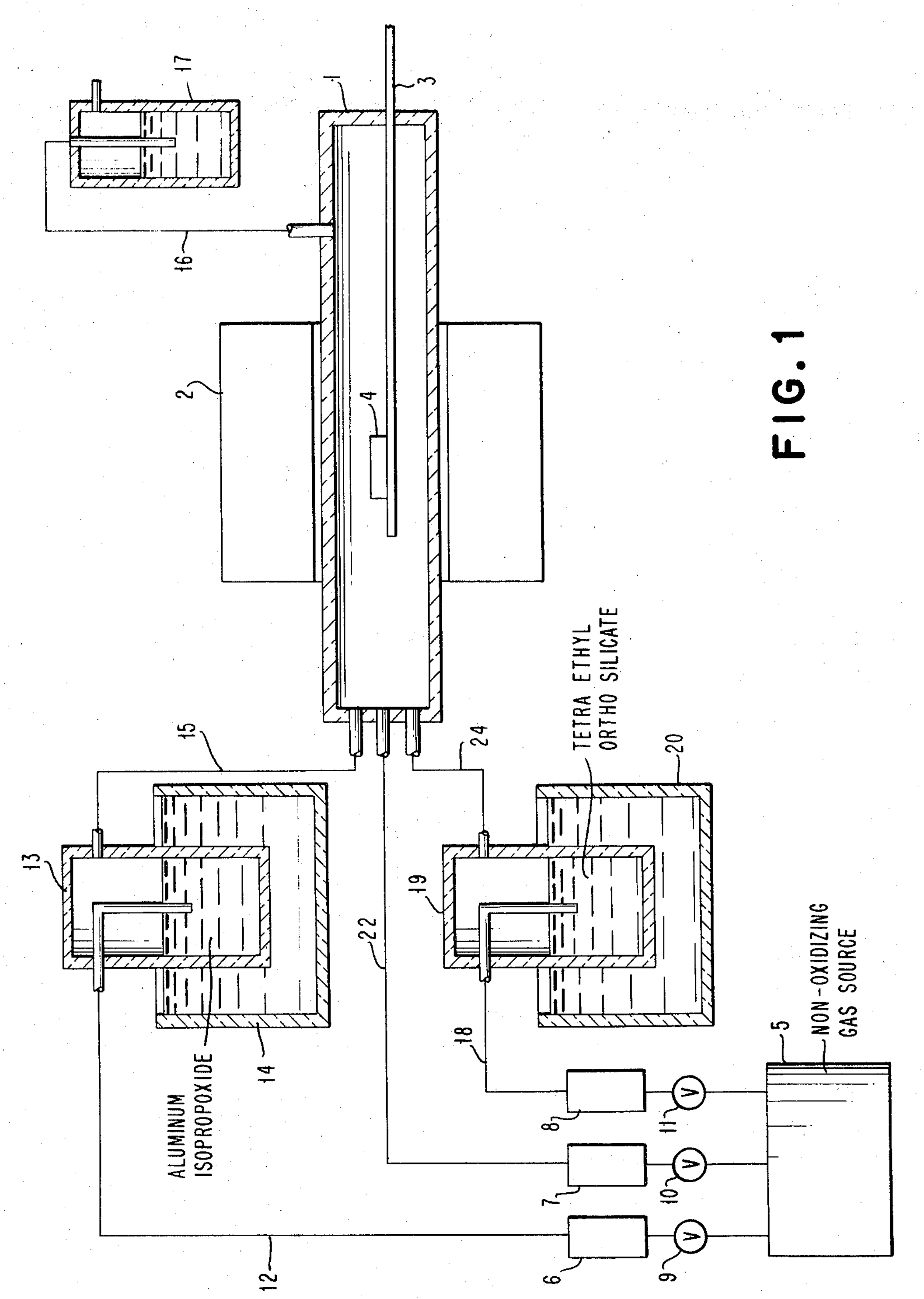
FIG. 1 is a partial cross-sectional schematic drawing of apparatus preferably used in practicing the method of the present invention.

Referring now to FIG. 1, there is shown a preferred apparatus in which the deposition of metal oxides is accomplished by the thermal decomposition of organic metal oxide containing compounds. The method of the present invention will be described below in connection with a germanium semiconductor substrate, with nitrogen as the ambient gas and with tetraethyl ortho silicate, hereinafter referred to as TEOS, as a source for silicon dioxide and aluminum isopropoxide as a source of aluminum oxide being deposited as a mixture.

In FIG. 1, a quartz firing tube 1, is shown disposed within a tube furnace 2. Tube 1, has a removable substrate holder 3, carrying a semiconductor substrate 4 of germanium disposed within it.

A source 5 of nonoxidizing gas, preferably, nitrogen is shown connected to flowmeters 6,7,8 through adjustable valves 9,10,11, respectively. Piping 12 extends from flowmeter 6 to a bubbler 13 which contains an organic hydroxy salt of aluminum, preferably, aluminum isopropoxide. This latter material is normally a solid at room temperature, so it must be heated to a temperature sufficient to liquefy it in a constant temperature bath 14. Temperatures in the range of 118° – 270° C have been found suitable with a temperature of 125°C as a preferred temperature. The organic compound utilized is one which decomposes upon heating to a proper temperature to form a deposit of a metal oxide, aluminum oxide, in this instance. The only criterion relative to the decomposition temperature of the organic metal oxide compound is that the decomposition temperature be below the temperature at which the elements of the metal oxide normally diffuse into a semiconductor substrate. For aluminum isopropoxide, decomposition temperatures in the range of 250°C – 600°C have been found suitable with a temperature of 420°C being the preferred decomposition temperature. The aluminum isopropoxide is introduced into tube 1 by flowing nitrogen from source 5, through piping 12 to bubbler 13, where the nitrogen bubbles through the liquid aluminum isopropoxide which is carried as a vapor mixture with nitrogen via piping 15 into tube 1. Substrate 4 is heated by furnace 2 to the desired decomposition temperature and the aluminum isopropoxide on coming in contact with the heated surface of substrate 4 decomposes and deposits a film of aluminum oxide. The remaining decomposition products along with nitrogen exit from tube 1 via tubing 16 through exhaust bubbler 17 to the atmosphere.

To provide another metal oxide specie, silicon dioxide, in this instance, the nonoxidizing gas, nitrogen, is flowed from gas source 5, through valve 11 and flowmeter 8, iva piping 18 into bubbler 19 which contains an organic hydroxy salt of silicon, preferably, TEOS. Constant temperature bath 20 maintains the TEOS in liquid form at any temperature in the range of −20° to 50°C. Nitrogen bubbling through the TEOS carries vaporized TEOS via piping 21 to tube 1. In a manner similar to that described in connection with the aluminum isopropoxide, the TEOS decomposes at a temperature in the range of 250° – 600° C, preferably 420°C, in the region of substrate 4 and deposits the metal oxide, silicon dioxide, on substrate 4.

With valves 9,11 set for desired flow rates, aluminum isopropoxide and TEOS are carried to tube 1 where they decompose simultaneously as a mixture of aluminum oxide and silicon dioxide on substrate 4. Because the range of temperatures over which the organic compound chosen cracks is rather wide and because a narrow temperature gradient cannot be easily maintained in the region of substrate 4, a separate flow of nitrogen to increase the flow velocity in tube 1 is utilized to insure the deposition of the metal oxides on substrate 4. Thus, nitrogen from source 5 is delivered through valve 10 and flowmeter 7 via piping 22 to tube 1 in excess quantity at a desired flow rate.

Typical flow rate conditions to attain metal oxides of desired proportions are shown in the following examples.

EXAMPLE I

At flow rates of 1.7 liters/minute of nitrogen though both the aluminum isopropoxide and TEOS bubblers 13,19, respectively, and 6.6 liters/minute of nitrogen introduced directly via piping 22 to tube 1, a 30:70 weight percent of aluminum oxide to silicon dioxide mixture is obtained. The mixture was deposited at a substrate temperature of 420°C.

To obtain mixtures of the metal oxides having different proportions, adjustable valves 9,10,11 in conjunction with flowmeters 6,7,8, respectively, are adjusted to provide different flow rates of nitrogen. Adjusting the flow rates, of course, varies the amount of the decomposable metal oxide containing organic compounds delivered for cracking at substrate 4 and, therefore, the ultimate amounts of metal oxides which are deposited.

EXAMPLE II

If the flow rate of nitrogen is maintained at 1.7 liters/minute through aluminum isopropoxide bubbler 13 and the flow rate of nitrogen through TEOS bubbler 19 is changed to 0.2 liters/minute, and the flow rate of nitrogen via piping 22 to tube 1 is changed to 8.1 liters/minute, an 80:20 weight percent of aluminum oxide to silicon dioxide mixture is obtained. Deposition temperature was 420°C.

From the foregoing examples, it should be apparent that mixtures of aluminum oxide and silicon oxide which vary from just a trace of the constituents to an amount up to but not including 100 percent can be obtained by simply adjusting the flow rates of the nonoxidizing gas through the bubblers.

The ability to form such mixtures and to deposit metal oxide mixtures has great significance, because it was found somewhat unexpectedly that the resulting oxide films produced different induced surface potentials which were dependent on the oxide mixture and on the semiconductor on which the films were deposited.

Figure 2:
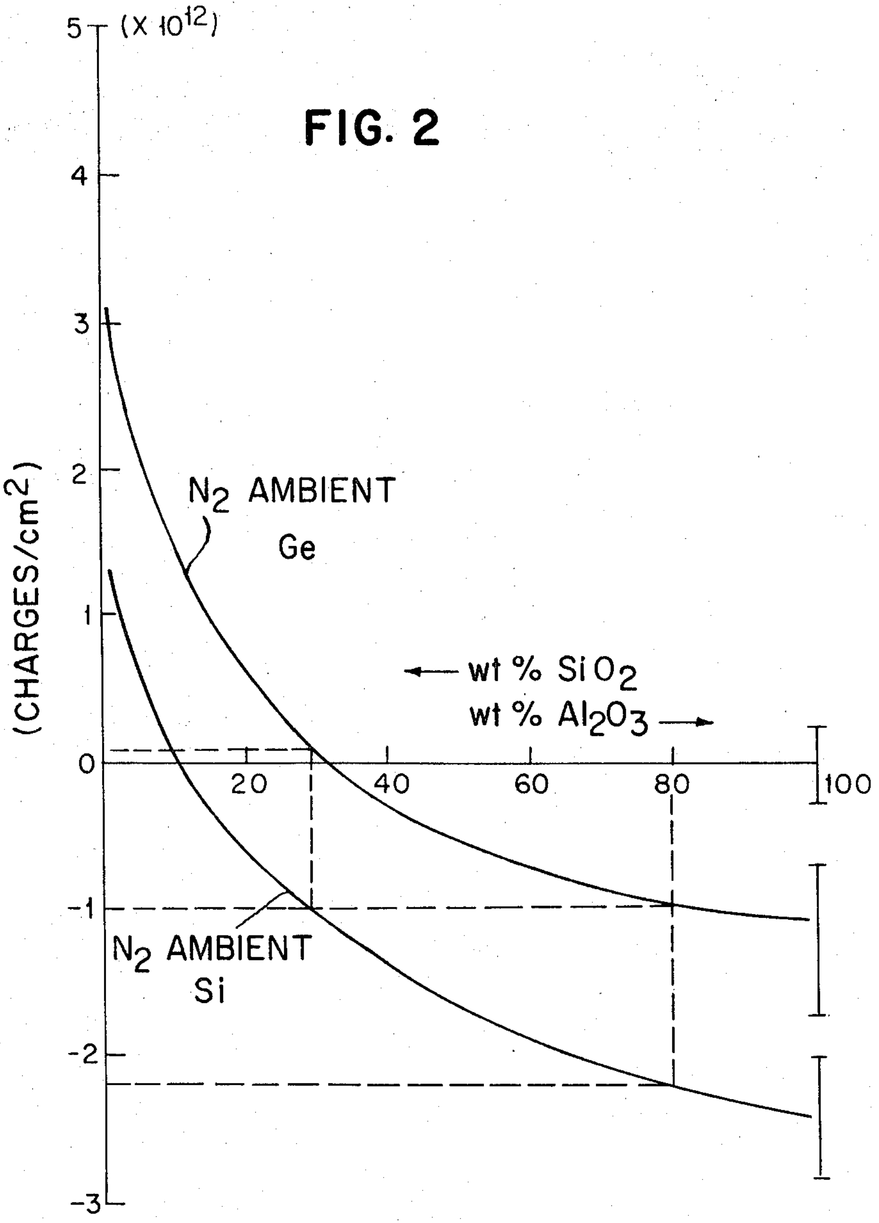
FIG. 2 is a graph showing the semiconductor flat band charge dependence on mixtures of $Al_2O_3$ - $SiO_2$ in passivating films for germanium and silicon in a nitrogen ambient.

A consideration of FIG. 2, which shows the semiconductor flat band charge dependence on mixtures of $Al_2O_3$ - $SiO_2$ in passivating films for germanium and silicon in a nitrogen ambient, indicates how the effective charge/cm$^2$ changes with a variation in weight percent of the metal oxides in a mixture and with the semiconductor material.

To obtain the curves of FIG. 2, the surface charges were measured for various oxide mixtures deposited on the surface of the semiconductors, germanium and silicon using the apparatus of FIG. 1. Surface charges were measured by a MOS capacitance voltage technique. This technique is described in a publication entitled "Ion Transport Phenomena in Insulating Films, " by E.H. Snow, A.S. Grove, B.E. Deal and C.T. Sah, in the "Journal of Applied Physics," Vol. 36, May 1965, on page 1665. Using a technique similar to that described in the above publication, the total effective charge at the surface of the semiconductor is determined. It should be appreciated that the charge values plotted in FIG. 2 will induce within the semiconductor an equal and opposite charge. The effective charge at the interface of the metal oxide surface is computed using the formula.

Charges/Area$=(\Delta V_{FB} \times C_{oxide})/(q \times \text{Area})$ $\Delta V_{FB}$ = displacement in volts of the flat band position from the zero voltage axis $C_{oxide}$ = capacitance of the oxide $q$ = electronic charge $-1.6 \times 10^{-19}$ coulombs Area = area of device being measured.

Referring now to FIG. 2 in conjunction with the examples described above, it can be seen that for an 80:20 mixture of aluminum oxide-silicon dioxide deposited on germanium in a nitrogen ambient the effective charge is equal to approximately $-1.0 \times 10^{-12}$ charges/cm$^2$.

For the same mixture deposited on a silicon substrate in a nitrogen ambient, the effective charge is approximately $-2.2 \times 10^{-12}$ charges/cm$^2$. Where the mixture is changed to 30:70 mixture of aluminum oxide-silicon dioxide, the effective charge on the surface of a germanium substrate is approximately $0.1 \times 10^{-12}$ charges/cm$^2$. For silicon, the effective induced charge is approximately $-1 \times 10^{-12}$ charges/cm$^2$. An effective charge of zero on the graph of FIG. 2 indicates that the semiconductor underneath the mixed oxide film has a substantially neutral conductivity type. The negative values on the graph indicate that the conductivity type of the semiconductor is P-type, while the positive values indicate an N-type conductivity at the interface of the metal oxide film and the semiconductor surface.

From the foregoing, it should be apparent that by varying the mixture of the deposited metal oxides in a nonoxidizing atmosphere, it is possible to adjust the conductivity type induced in a semiconductor to values of P-type conductivity, N-type conductivity or to a neutral conductivity type.

Parameters such as thickness of the deposited mixed oxide film appear to have negligible effect on the resulting surface charge induced in a semiconductor. The effect appears in deposited films having minimum thicknesses of only a few tens of Angstroms.

Figure 3:
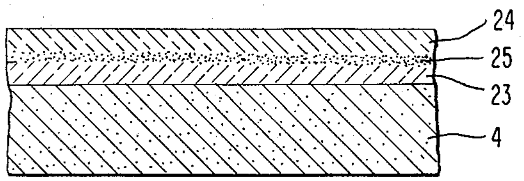
FIG. 3 is a cross-sectional view of a semiconductor substrate showing a region of mixed oxides between sequentially deposited layers of metal oxides, which region affects the surface potential at the surface of the semiconductor.

As indicated hereinabove, the plurality of metal oxides may be deposited sequentially as well as simultaneously to produce a region of a mixture of metal oxides at an interface of the metal oxide layers. FIG. 3, shows a cross-sectional view of a semiconductor substrate 4, such as germanium or silicon, having metal oxide layers 23,24 such as silicon dioxide and aluminum oxide, respectively, deposited sequentially on the surface of the semiconductor. A region 25 of mixed oxides at the interface of layers 23,24 is obtained by heating substrate 4 in tube 1 over a temperature range of 200° - 800° C for 24 hours in nitrogen after sequentially depositing layers 23,24 in nitrogen in the apparatus of FIG. 1. The deposition is accomplished by simply closing valve 4 when silicon dioxide is to be deposited and closing valve 11 when aluminum oxide is to be deposited. In connection with the deposition of silicon dioxide in nitrogen, it is not possible using the apparatus of FIG. 1 to obtain a layer of 100 percent silicon dioxide. It has been found, however, that a layer of substantially pure silicon dioxide can be deposited if a trace of a catalyst is introduced into the system of FIG. 1. Aluminum oxide, in addition to other materials, acts as a catalyst to cause the deposition of substantially pure $SiO_2$. In the apparatus of FIG. 1, when the vaporized TEOS is being introduced into tube 1, a small amount of vaporized aluminum isopropoxide can be introduced at the same time.

Mixed oxide layer 25 in FIG. 3 is an aluminum silicate compound which results from the interdiffusion of silicon and aluminum from layer 23 and 24 into the adjacent metal oxide layers. The diffusion, of course, is greater, the longer the substrate is heated and different values of surface charges at the semiconductor surface can be expected as the heating time and temperature is varied for a given thickness of layer 23. Layer 23, of course, should not be so thick as to preclude the formation of a layer of mixed oxides at a distance reasonably close to the surface of substrate 24. The effect on surface charges can be expected to take place where the distance of layer 25 from the surface of the substrate does not exceed 2,000 A. Of course, where the oxides completely interdiffuse so that layer 25 is contiguous with the surface of substrate 4, the condition where the oxides have been simultaneously deposited is duplicated.

The present invention has been described hereinabove in connection with a preferred deposition technique, a preferred nonoxidizing atmosphere and preferred constituents but, it should be appreciated that other deposition techniques, other nonoxidizing atmospheres and other constituents may be used equally well in the practice of this invention.

With respect to the technique of depositing, it should be clear that the effects obtained relative to semiconductor surface potential are not dependent on the manner in which the oxides are deposited except for the gaseous ambient, but are dependent on the mixture of the oxides, the properties of the elements involved and the semiconductor material used. Accordingly, the mixed oxides may be deposited by any known technique which does not require the presence of an oxidizing atmosphere. The nonoxidizing gas, as indicated above, need only be present in trace amounts and such nonoxidizing ambient should be present to the exclusion of oxidizing gases. Any of the known inert or reducing gases are satisfactory. Values of effective charge obtained, however, may vary from gas to gas for a fixed mixture. Inert gases, in addition to nitrogen, which may be used are argon, neon, helium, xenon and krypton. Reducing gases such as hydrogen and forming gas may also be used.

The metal oxides used may be obtained from the metal oxides alone or from organic metal oxide bearing compounds such as the organic hydroxy salts of aluminum, silicon and boron which do not require the presence of ambient oxygen during their decomposition. The alcholates of aluminum and silicon have been utilized hereinabove in describing the preferred embodiments of this method. Other suitable alcoholates and phenolates are listed in U.S. Pat. No. 2,805,965, in the name of P. Robinson and assigned to Sprague Electric Co., North Adams, Mass.

The preferred embodiments of the invention have indicated the formation of mixtures of two metal oxides, but, the mixtures ultimately formed may consist of three or more metal oxides. Thus, in FIG. 1, another bubbler containing an organic metal oxide containing compound of boron, boron methoxide, for example, could be added to the system to provide the metal oxide, boron oxide. The simultaneous deposition of metal oxides in FIG. 1 would then consist of a mixture of silicon dioxide, and boron and aluminum oxides. Alternatively, boron oxide may be substituted for silicon dioxide since, like silicon dioxide, its presence on the surface of a semiconductor induces a region of N-type conductivity. It is interesting to note that in spite of the fact that boron is a P-type dopant like aluminum when diffused into a semiconductor, it induces an N-type region when deposited on a semiconductor surface. Aluminum oxide alone induces a P-type region on the surface of the semiconductor.

In FIG. 3, layers 23,24 may also consist of a plurality of mixed oxides so that region 25 consists of a mixture of all the metal oxides used.

One useful application of the above described method is found in the manufacture of field effect transistors. For certain applications, n-p-n devices must be normally-off while for other reasons a certain conductivity type is required. By simply depositing a given mixture of metal oxides as indicated by the curves of FIG 2, a P-type conductivity of a given desired value can be provided which makes the device normally-off without need for external biasing.

We claim:

1. An article comprising:
a layer of aluminum oxide having a negative charge,
a layer of boron oxide having a positive charge disposed under said aluminum oxide layer and,
a silicon substrate having an induced positive charge in a surface thereof adjacent said boron oxide layer said substrate being disposed under said boron oxide layer, said negative charge and said first-mentioned positive charge coacting to produce said induced positive charge.

2. A method for controlling semiconductor surface potential comprising the steps of:
forming a layer of silicon oxide in a non-oxidizing atmosphere on the surface of a semiconductor substrate said semiconductor being one selected from the group consisting of germanium and silicon, and
depositing a layer of aluminum oxide in a non-oxidizing atmosphere on said silicon oxide layer at a temperature below which the constituents of said layers normally diffuse.

3. A method for controlling semiconductor surface potential comprising the steps of:
forming a layer of silicon oxide on a surface of a silicon semiconductor substrate, and
depositing a layer of aluminum oxide in a non-oxidizing atmosphere on said silicon oxide layer at a temperature below which the constituents of said layers normally diffuse.

4. A method for controlling semiconductor surface potential comprising the steps of:
forming a layer of silicon oxide on the surface of a semiconductor substrate said semiconductor being one selected from the group consisting of germanium and silicon; and,
depositing a layer of aluminum oxide on said silicon oxide layer in a nonoxidizing atmosphere at a temperature below which the constituents of said layers normally diffuse.

5. A method according to claim 1 wherein said layer of silicon oxide is a layer of silicon dioxide.

6. A method according to claim 1 further including the step of heating said layers and said semiconductor substrate for times and at temperatures sufficient to cause interdiffusion of a portion of said layers.

7. A method for controlling semiconductor surface potential comprising the step of:
depositing first and second layers of different metal oxides selected from the group consisting of silicon oxide, aluminum oxide and boron oxide in sequence on a surface of a substrate of semiconductor material selected from the group consisting of germanium and silicon in a non-oxidizing atmosphere and at a temperature below which the constituents of said metal oxides normally diffuse said aluminum oxide being the second layer.

8. A method according to claim 4 further including the step of heating said layers at a temperature and for a time sufficient to cause interdiffusion of a portion of said first and second layers.

9. A method according to claim 7 wherein said non-oxidizing atmosphere includes reducing gases and inert gases.

10. A method according to claim 9 wherein said inert gases include nitrogen, helium, argon, xenon, neon and krypton.

11. A method according to claim 9 wherein said reducing gases include hydrogen and forming gas.

* * * * *